US005790566A

United States Patent [19]
Laskowski

[11] Patent Number: 5,790,566
[45] Date of Patent: *Aug. 4, 1998

[54] METHOD AND DEVICE FOR DEPUNCTURING DATA

[75] Inventor: Paul J. Laskowski, Columbia, Md.

[73] Assignee: Hughes Electronics, Los Angeles, Calif.

[*] Notice: The term of this patent shall not extend beyond the expiration date of Pat. No. 5,566,189.

[21] Appl. No.: 298,627

[22] Filed: Aug. 31, 1994

[51] Int. Cl.[6] .............. G06F 11/00; G08C 25/00; H03M 13/00; H04L 1/00
[52] U.S. Cl. .............................. 371/30; 371/43
[58] Field of Search .............. 371/43, 44, 45, 371/46, 30, 371; 375/246, 247, 253

[56] References Cited

U.S. PATENT DOCUMENTS

| | | | |
|---|---|---|---|
| 4,675,724 | 6/1987 | Wagner | 348/498 |
| 4,939,734 | 7/1990 | Heichler | 371/43 |
| 5,019,823 | 5/1991 | Bream et al. | 342/175 |
| 5,029,331 | 7/1991 | Heichler et al. | 371/43 |

Primary Examiner—Roy N. Envall, Jr.
Assistant Examiner—Emmanuel L. Moise
Attorney, Agent, or Firm—J. Whelan; Wanda Denson-Low

[57] ABSTRACT

A circuit and method for depuncturing data in the receiver circuitry of a digital communications system. The depuncturing circuit includes a multiplexer circuit that receives a punctured stream of data and a delayed version of the punctured stream of data. The multiplexer circuit generates a multiplexer output which can be either a bit from the punctured stream of data, or a bit from the delayed version of the punctured stream of data. A control circuit is coupled to the multiplexer circuit to select which multiplexer input appears on the multiplexer output. The control circuit selects the multiplexer output according to a depuncture pattern that reproduces the pre-punctured order of the data stream. The control circuit may be a counter coupled to a decoder which is coupled to the multiplexer. The decoder may be specially designed to decode the predetermined depuncture pattern and rate, and the counter controls the decoder's movement through the depuncture pattern and rate. Alternatively, the decoder may be a programmable device, allowing the designer to program the desired depuncture pattern and rate into the decoder.

20 Claims, 4 Drawing Sheets

FIG. 3.

RATE 2/3

P1:10　　A0 A1 (A2) A3 (A4) ... DATA TO PUNCTURE P1 INPUT
P2:11　　B0 (B1) B2 B3 (B4) ... DATA TO PUNCTURER P2 INPUT

A0 B1 B2  A4 ... DATA FROM PUNCTURER I OUTPUT
B0 A2 B3  B4 ... DATA FROM PUNCTURER Q OUTPUT

RATE 6/7

P1:100101　　A0 A1 A2 (A3) A4 (A5) A6 A7 A8 (A9) A10 (A11) A12 A13... DATA TO PUNCTURE P1 INPUT
P2:111010　　B0 (B1) B2 (B3) B4 (B5) B6 B7 (B8) B9 (B10) B11 B12 (B13)... DATA TO PUNCTURER P2 INPUT

A0 B1 A3 A5 B8 B10 ... DATA FROM PUNCTURER I OUTPUT
B0 B2 B4 A6 B7 A9 A11 ... DATA FROM PUNCTURER Q OUTPUT

FIG. 4.

RATE 2/3

I:10 A0 B1 B2 A4 ... DATA TO DEPUNCTURE I INPUT
Q:11 B0 A2 B3 B4 ... DATA TO DEPUNCTURER Q INPUT

A0 X A2 X ... DATA FROM PUNCTURER P1 OUTPUT X=PUNCTURED BIT
B0 B1 B2 B3 ... DATA FROM PUNCTURER P2 OUTPUT X=PUNCTURED BIT

RATE 6/7

P1: A0 B1 A3 A5 B6 B8 B10 ... DATA TO DEPUNCTURE I INPUT
P2: B0 B2 B4 A6 B7 A9 A11 ... DATA TO DEPUNCTURER Q INPUT

A0 X X A3 X A5 A6 XX A9 X A11 ... DATA FROM DEPUNCTURER P1 OUTPUT
B0 B1 B2 B4 X B6 B7 B8 X B10 X ... DATA FROM DEPUNCTURER P2 OUTPUT

X = PUNCTURED BIT

FIG. 5.

RATE 2/3

I: A0 B1 B2 B4 ... DATA TO DEPUNCTURE I INPUT
Q: B0 A2 B3 B4 ... DATA TO DEPUNCTURER Q INPUT

P1 OUTPUT A0 X A2 X A4
P2 OUTPUT B0 B1 B2 B3 B4

P1 SELECTION I X QD X I ... I = I INPUT Q = Q INPUT ID = I DELAYED QD = Q DELAYED
P2 SELECTION Q I I QD Q ... I = I INPUT Q = Q INPUT ID = I DELAYED QD = Q DELAYED
DEPUNCTURE P1 0 1 0 1 0 ...
DEPUNCTURE P2 0 0 0 0 0 ...
COUNTER VALUE 0 1 2 3 0 ...

METHOD AND DEVICE FOR DEPUNCTURING DATA

BACKGROUND OF THE INVENTION

Error correction is extremely important in digital communications. This is particularly true when the transmitted information signals are complicated data streams such as digitized, compressed video. However, error correction algorithms increase the amount of data to be transmitted, thus increasing the bandwidth requirements of the transmission medium. To counteract the increased bandwidth requirements, a procedure known as "puncturing" is applied to the data prior to transmission. Puncturing takes data out of the error corrected data stream in a predetermined "puncture pattern" applied at a predetermined "puncture rate." On the receiving end, the punctured data must be "depunctured" which is essentially the opposite of puncturing. Depuncturing reorders the data into its original pre-puncture sequence, and identifies the positions in the data stream where data was removed (or punctured).

Prior methods of depuncturing data include the use of logic circuitry, such as shift registers and the like, to store the entire puncture pattern. The punctured data stream is applied to the logic circuitry which performs a load and shift operation to shift out the appropriate bits in the pre-puncture sequence. However, storing the entire puncture pattern in shift registers or similar components requires a relatively large amount of logic circuitry, particularly when the puncture pattern is long. The design and implementation of such prior circuitry quickly becomes complicated for long puncture patterns. Also, such circuitry is not easily modified to accommodate a different puncture pattern and rate.

Accordingly there is a need for a depuncturing circuit that is relatively simple, uses few logic components, is easy to design and implement, and is easily modified to accommodate different puncture patterns and puncture rates.

SUMMARY OF THE INVENTION

The present invention relates in general to a method and device for depuncturing data in the receiver circuitry of a digital communications system. The method and device of the present invention provides a depuncturing circuit that is relatively simple, uses few logic components, is easily designed and implemented, and is easily modified to accommodate different puncture patterns and rates.

The depuncturing circuit and method of the present invention takes advantage of the observation that a given "bit" in a punctured data stream will never be more than a predetermined number of "bit-spaces" or clock cycles away from its original position in the pre-punctured data stream. Thus, each bit in a punctured data stream is either in its pre-puncture position or "n" bits away from its pre-puncture position. The punctured data stream is essentially a time line, and thus, depuncturing may be accomplished according to the present invention by sequentially selecting (according to the appropriate depuncture sequence) the current bit in the data stream, a delayed version of the current bit in the data stream, or a "puncture" signal which indicates that the bit position was punctured and therefore the logic level of that bit position is unknown. The selection procedure may be implemented by using a multiplexer circuit to accept the different possible inputs, and a control circuit connected to the multiplexer circuit to sequentially select the inputs according to the appropriate depuncture sequence.

Accordingly, the depuncturing circuit of the present invention includes a multiplexer circuit that receives a punctured stream of data and a delayed version of the punctured stream of data. The multiplexer circuit generates a multiplexer output which can be either a bit from the punctured stream of data, or a bit from the delayed version of the punctured stream of data. A control circuit is coupled to the multiplexer circuit to select which multiplexer input appears on the multiplexer output. The control circuit selects the multiplexer output according to a depuncture pattern that reproduces the pre-punctured order of the data stream.

In one embodiment of the invention, the control circuit includes a counter coupled to a decoder which is coupled to the multiplexer. The decoder is designed to decode the predetermined depuncture pattern and rate, and the counter controls the decoder's movement through the depuncture pattern and rate. Alternatively, the decoder may be a programmable device, which would allow the desired depuncture pattern and rate to be stored or programmed into the decoder.

In still another embodiment of the invention, the stream of punctured data includes an in-phase component (I) and a quadrature-phase component (Q). Similarly, the delayed version of the punctured data includes a delayed I component (ID) and a delayed Q component (QD). The multiplexer output is divided into a first multiplexer output (P1) and a second multiplexer output (P2).

The present invention also provides a method of depuncturing punctured data. The steps include providing a punctured stream of data, a delayed version of the punctured stream of data, multiplexing the punctured data and the delayed punctured data to a multiplexed output, and controlling the multiplexing operation such that the punctured data and the delayed punctured data appear on the multiplexer output in a sequence that follows a predetermined depuncture pattern.

As described in greater detail below, the depuncturing circuit and method of the present invention provides a simple design that uses relatively few logic circuits and accordingly reduces cost. The circuit is easily designed for a variety of puncture patterns and rates using computer-aided circuit design. Finally, the puncture pattern and rate can be easily changed by simply re-designing and replacing the decoder, or, if a programmable decoder is used, re-programming the decoder.

The invention itself, together with further objects and attendant advantages, will best be understood by reference to the following detailed description, taken in conjunction with the accompanying drawings.

BRIEF DESCRIPTION OF THE DRAWINGS

FIG. 3 illustrates examples of a ⅔ puncture rate and a 5/7 puncture rate.

FIG. 4 illustrates examples of a ⅔ depuncture rate and a 5/7 depuncture rate.

FIG. 5 illustrates the implementation of a ⅔ depuncture rate and pattern utilizing the depuncture logic circuit shown in FIG. 2.

DETAILED DESCRIPTION OF THE DRAWINGS

The present invention relates to a depuncturing circuit and method which may be utilized in any digital communications system that uses forward error correction (FEC)

algorithms, data "puncturing," and data "depuncturing." In general, FEC algorithms add bits to the data stream in a special way to allow for error identification and correction in the system's receiver.

Figure 1:
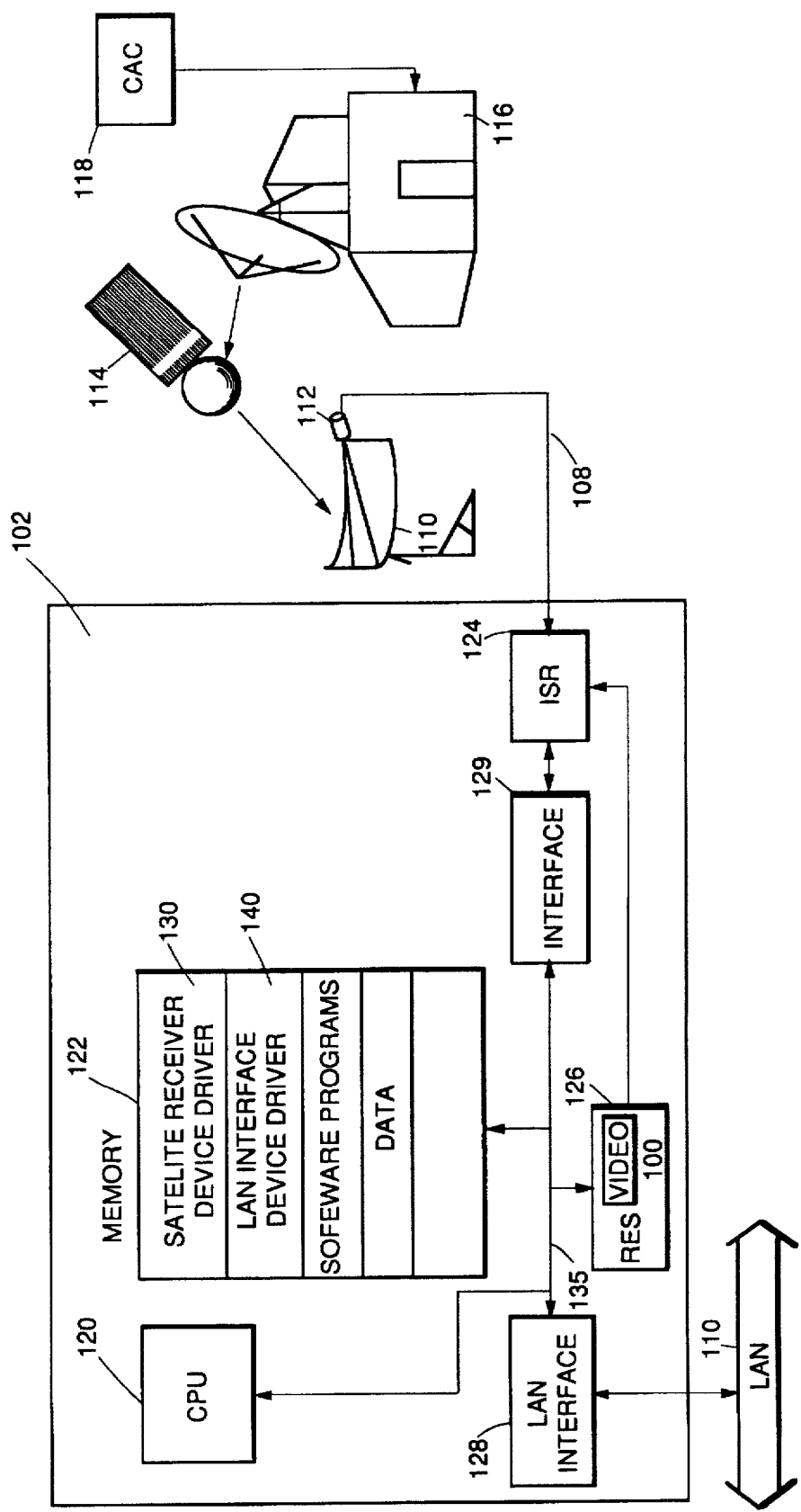
FIG. 1 is a block diagram of a digital communications system capable of utilizing the present invention.

FIG. 1 is block diagram illustrating generally the relevant portions of a digital communications system 10 capable of utilizing the depuncturing circuit and method of the present invention. The system 10 could be, for example, a wireless satellite digital data system, a voice digital data system, or a video/audio digital data system. The system 10 includes a transmitting side 12 connected to a receiving side 14 by an RF transmission medium 16.

On the transmitting side 12, a pair of data streams, P1 and P2, are fed to a puncturer 18 which punctures the streams in a prescribed puncture pattern or rate. The puncturer 18 outputs to a demodulator 20 a punctured data stream divided into two components, an in-phase component (I) and a quadrature-phase (Q) component. The modulator 20 modulates I and Q to an RF signal which is transmitted on a transmission medium 16 to a demodulator 26 on the receiver side 14. The demodulator 26 demodulates the RF signal back to I and Q components which are then applied to a depuncturer 28. The depuncturer 28 reorders the punctured I and Q components into their pre-puncture sequences (P1' and P2') and provides an indicator (not shown) identifying the bit positions that were punctured and whose logic value is therefore unknown.

Figure 2:
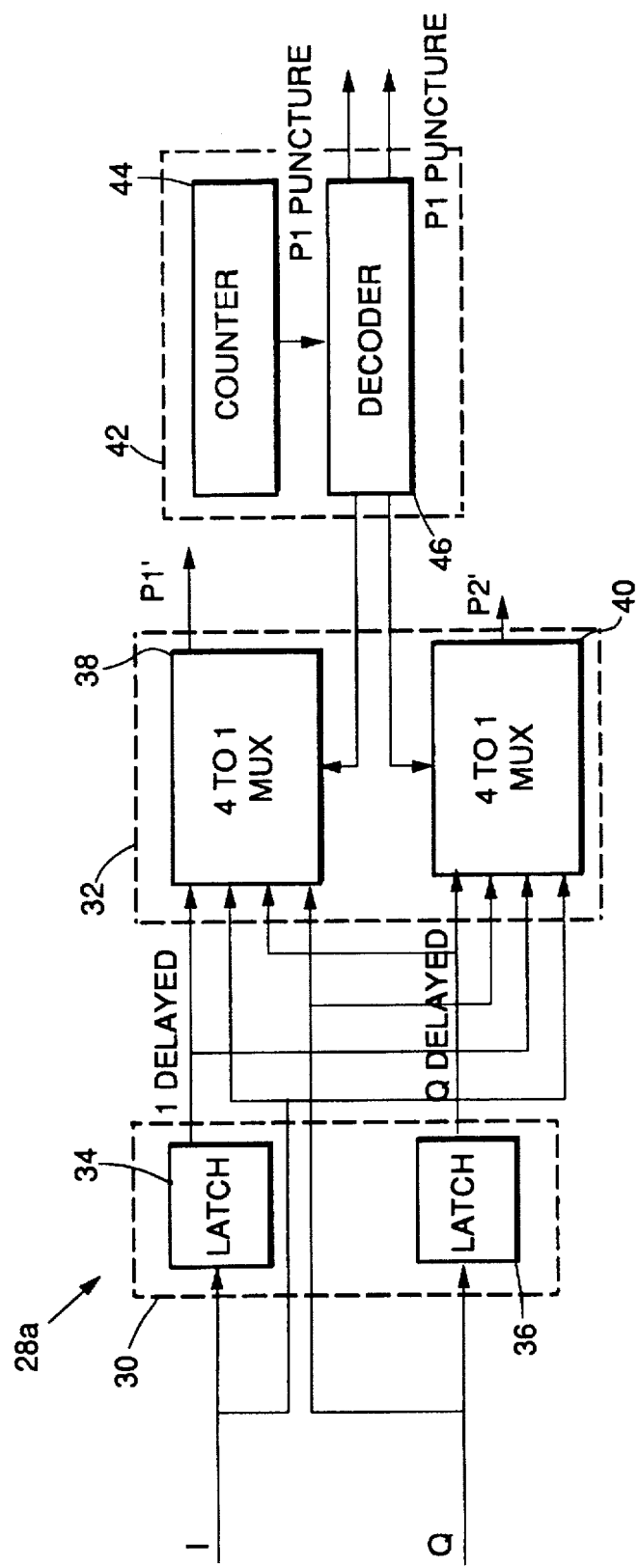
FIG. 2 is a block diagram of a depuncturing logic circuit embodying the present invention.

FIG. 2 illustrates a preferred depuncturing circuit 28a embodying the present invention. The circuit 28a includes a delay circuit 30, a multiplexer circuit 32, and a control circuit 42. The delay circuit 30 may be implemented as a pair of latch circuits 34, 36. The multiplexer circuit 32 may be implemented as a pair of "4 to 1" multiplexer circuit 38, 40. The control circuit 42 may be implemented as a counter 44 and a decoder 46. In general, the latch circuits 34, 36 generate delayed versions of I and Q by each holding their output for one clock cycle. I, Q, I-delayed (ID), and Q-delayed (QD) are provided to each of the multiplexers 38, 40, which generate outputs P1' and P2', respectively. The decoder 46 controls the multiplexers 38, 40 and selects which inputs (I, Q, ID, QD) appear on P1' and P2' according to a predetermined depuncture pattern. The decoder 46 also generates the signals P1-puncture and P2-puncture which identify the current signal on P1' or P2' as a "punctured" bit whose logic value is unknown.

The decoder 46 is preferably a conventional logic unit which may be custom designed to decode the desired depuncturing pattern and rate. Alternatively, at increased cost, the decoder 46 may be a programmable unit which can be programmed by the designer to decode the desired depuncturing pattern and rate. The decoder 46 is connected to the selection inputs of the multiplexers 38, 40 to select which inputs (I, Q, ID, QD) appear on the multiplexer outputs P1', P2' based on the depuncturing pattern. The counter 44 keeps track of the number of positions in the depuncture pattern and rate and communicates to the decoder 46 the current position of the depuncture pattern.

The depuncturing circuit and method of the present invention takes advantage of the observation that a given data bit in a punctured data stream will never be more than a predetermined number of "bit-spaces" or clock cycles away from its original position in the pre-punctured data stream. In the disclosed examples, a given data bit in a punctured data stream is never more than one bit-space or clock cycle away from its original position in the pre-punctured data stream. Thus, each bit in the punctured data stream is either in its pre-puncture location or one bit away from its pre-puncture location. Because the punctured data stream is essentially a time line, it has been discovered that depuncturing may be accomplished simply by sequentially selecting (according to the appropriate depuncture sequence) the current bit in the data stream, a delayed version of the current bit in the data stream, or a "puncture" signal which indicates that the bit position was punctured and therefore the logic level of that bit position is unknown. This selection procedure may be implemented according to the present invention by using a multiplexer circuit to accept the different possible inputs, and a control circuit connected to the multiplexer circuit to sequentially select the inputs according to the predetermined depuncture sequence. Preferably, the control circuit is implemented as a counter and decoder. The decoder is designed to decode according to the depuncture pattern and rate, and the counter keeps track of time and moves the decoder through the depuncture patter in the proper sequence.

In order to provide a fuller description of the depuncturing circuit and method of the present invention, FIGS. 3 and 4 will now be described in connection with puncturing and depuncturing patterns and rates, and how puncturing and depuncturing are accomplished.

FIG. 3 is a text/graphic chart illustrating a ⅔ puncture rate and pattern, along with a 9/7 puncture rate and pattern. The first number in the puncture "rate" represents the total number of bits before puncturing and encoding, and the second number in the puncture rate represents the total number of bits that are transmitted in the punctured data stream. The first number is actually doubled because the encoder, which applies an FEC algorithm such as convolutional encoding, doubles the number of bits being transmitted. Thus, a ⅔ puncture rate transmits three bits for every four bits in the encoded, unpunctured bit stream, and a 9/7 puncture rate transmits seven bits for every twelve bits in the encoded, unpunctured bit stream.

The ⅔ puncture rate and pattern and the 9/7 puncture rate and pattern are shown in FIG. 3 as the groups of zeros and ones located next to "P1" and "P2" on the left side of the figure. The ⅔ puncture rate and pattern is represented by four zeros and ones, and the 9/7 puncture rate and pattern is represented by twelve zeros and ones. The puncture patterns are arranged such that a "one" represents a transmitted data bit, and a zero represents a punctured bit (removed or deleted). The top and leftmost bit is typically a one in most puncture patterns. Because each rate, ⅔ and 9/7, has an odd number of transmission bits, two puncture pattern groups are required in order to get a repeating pattern.

FIG. 3 also illustrates the sequence of the two data streams into the puncturer ("data to puncture P1 input" and "data to puncture P2 input") for both the ⅔ puncture rate and 9/7 puncture rate. The circled bits are transmitted in the puncture pattern. FIG. 3 also illustrates the sequence of the punctured data bit stream leaving the puncturer ("data from puncture I output" and "data from puncturer Q output") for both the ⅔ puncture rate and 9/7 puncture rate.

The ⅔ puncture rate and pattern illustrated in FIG. 3 is (reading from top to bottom, column by column) 1101, which means that the puncturer transmits all P2's that come into the puncturer but every other P1 is dropped or punctured. Thus, if we represent the time line of data into P1 by A0, A1, A2, A3, and the time line of data into P2 by B0, B1, B2, B3, then the time line output from the puncturer would be A0, B1, B2, A4 for the I output, and B0, A2, B3, B4 for the Q output. A0 and B0 were transmitted as received. A1 was punctured, and so B1 was moved up to the I output, and accordingly A2 was transmitted on line Q and B2 was transmitted on line I. A3 was punctured, and so B3 was transmitted on the Q output, and accordingly A4 was transmitted on line I and B4 was transmitted on line Q.

A similar example is illustrated in FIG. 3 for the 5/7 puncture rate and pattern. The 5/7 example illustrates how quickly the puncture pattern becomes complicated as the size and length of the puncture rate and pattern increases.

The depuncturer 28a reorders the data stream from the transmitted I/Q data stream back to the punctured P1/P2 data stream. Data bits that were removed from the original data stream cannot be recreated, but instead "puncture" signals are generated to indicate that the bit position was originally punctured, and this information provides the forward error correction (FEC) processor (not shown) with information for error detection and correction.

FIG. 4 is a text/graphic chart illustrating depuncturing, which is essentially the reverse of the puncturing process illustrated in FIG. 3. Examples are shown in FIG. 4 for both the 2/3 and the 5/7 depuncture rate and pattern. The 2/3 depuncture rate and pattern is 1101, and so A0 and B0 both remain in the same position. The next position was punctured, and so an X is placed on the P1' output and B1 is moved down to P2', A2 is moved up to P1', and B2 is moved down to P2'. The next position was punctured, and so an X goes on P1' and B3 remains on P2'. Thus, depuncturing recreates the time line positions of the original unpunctured data stream except for the punctured bit positions which are represented by an X to indicate that the logic level is unknown.

A similar example is illustrated in FIG. 4 for the 5/7 depuncture rate and pattern. The 5/7 example illustrates how quickly the depuncture rate and pattern becomes complicated as the size and length of the depuncture rate and pattern increases.

FIG. 5 is a text/graphic chart illustrating how a 2/3 puncture rate and pattern are depunctured using a 2/3 depuncture rate and pattern and the depuncturing circuit 28a illustrated in FIG. 2. The rate 2/3 counter 44 repeatedly cycles its count through 0, 1, 2, 3. When the counter value is 0, the decoder 46 selects P1' by instructing the multiplexer 38 to place the current bit value of I (A0) on the multiplexer 38 output, and selects P2' by instructing the multiplexer 40 to place the current bit value of Q (B0) on the multiplexer 40 output. Neither of the first bits were punctured, and so the outputs from the decoder 46 are both zero.

On the next clock cycle, the counter value is 1, the P1' output from the decoder 46 is 1, thus identifying P1' as a punctured bit (X) whose value is unknown. The decoder 46 selects P2' by instructing the multiplexer 40 to place the current bit value of I (B1) on the multiplexer 40 output.

On the next clock cycle, the counter value moves to 2, and the decoder 46 selects P1' by instructing the multiplexer 38 to place the previous bit value of Q (QD) (A2) on the multiplexer 38 output, and selects P2' by instructing the multiplexer 40 to place the current value of I (B2) on the multiplexer 40 output. Neither of these bits were punctured, and so the outputs from the decoder 46 are both zero.

On the next clock cycle, the counter value is 3, and the P1' output from the decoder 46 is 1, thus identifying P1' as a punctured bit (X) whose value is unknown. The decoder 46 selects P2' by instructing the multiplexer to place the previous bit value of Q (QD) (B3) on the multiplexer 40 output.

Thus, the counter 44 and decoder 46 provide the necessary control signals to select the two multiplexers 38, 40, and different puncture patterns may be programmed into the counter 44 and decoder 46 to provide a vast range of depuncturing patterns. The counter 44 keeps track of the location of the depuncture sequence, while the decoder 46 selects the desired data bit stream. To maintain a constant data rate, a gated clock is employed to keep the system timing synchronized. The enable for the gated clock can be used in the counter 44.

Accordingly, the depuncture circuit of the present invention accommodates both small and large depuncture rates and patterns with a small amount of logic. The examples disclosed herein support two puncture patterns, but it is possible to design a circuit according the disclosed method to handle multiple puncture patterns with only small modifications to the decode and counter logic.

The depuncture circuit is preferably implemented in a single application specific integrated circuit (ASIC) which also performs other related reception and demodulation functions. The functional blocks shown in FIG. 2 preferably correspond to hardwired gate array logic so that the depuncturing may be performed at sufficiently high data rates (e.g. on the order of forty megabits per second). Applying techniques well known in the art, the ASIC may be designed using the Verilog HDL (Hardware Description Language) computer-aided design program which enables a logic synthesizer (for example, Synopsys Design Compiler) to create a gate level design. The flexibility of the disclosed depuncture circuit, along with its compatibility with computer-aided design, enable extremely fast re-designs, thus providing excellent reusability of the initial depuncture circuit design.

Of course, it should be understood that a wide range of changes and modifications can be made to the preferred embodiment described above. For example, the latch circuits 34, 36 could be a single latch with multiple inputs and outputs, and the two 4 to 1 multiplexers could be a single 8 to 2 multiplexer. Also, additional delay circuits could be added in situations where the puncture pattern allows a bit to be more than one bit-space or clock cycle away from its original, pre-punctured bit position. It is therefore intended that the foregoing detailed description be regarded as illustrative rather than limiting, and that it be understood that it is the following claims, including all equivalents, which are intended to define the scope of this invention.

What is claimed is:

1. A device comprising:
   a multiplexer circuit receiving puncture digital data and a delayed version of said punctured digital data said multiplexer circuit generating a multiplexer output; and
   a controller coupled to said multiplexer circuit and causing said punctured digital data and said delayed punctured digital data to appear on said multiplexer output in a predetermined pattern,
   wherein a given bit in the punctured digital data is not more than a predetermined number of bit spaces away from its position in the predetermined pattern.

2. A device according to claim 1, wherein said predetermined pattern comprises an order of said punctured dial data before it was punctured.

3. A device according to claim 2, wherein said controller generates a puncture signal that identifies which data signals on said multiplexer output have been punctured.

4. A device according to claim 1 wherein said controller comprises:
   a counter coupled to a decoder; and
   said decoder coupled to said multiplexer;

whereby said decoder selects said multiplexer output to follow said predetermined pattern, and said counter controls said decoder's movement through said predetermined pattern.

5. A device according to claim 1 wherein said controller comprises a programmable controller capable of being programmed with said predetermined pattern.

6. A device according to claim 5 wherein said controller may be re-programmed with a different predetermined pattern.

7. A device according the claim 1 wherein:

said punctured digital data comprises a first component and a second component; and said delayed version of said punctured digital data comprises a delayed first component and a delayed second component.

8. A device according to claim 7 wherein:

said first component comprises an in-phase component;

said second component comprises a quadrature-phase component;

said delayed first component comprises a delayed in-phase component; and said delayed second component comprises a delayed quadrature-phase component.

9. A device according to claim 8 wherein said multiplexer output comprises a first output component and a second output component.

10. A device according to claim 9, wherein said controller generates a puncture signal that identifies which data signals on said multiplexer output have been punctured.

11. A device according to claim 1 wherein:

said punctured digital data comprises a time line of bit positions; and said delayed version of said punctured digital data comprises shifting said bit positions of said punctured digital data by a predetermined number of bit positions.

12. A device according to claim 11 wherein said predetermined number is one.

13. A depuncturing device comprising:

a multiplexer circuit receiving inputs including an in-phase component of a punctured digital data, a quadrature-phase component of said punctured digital data, a delayed version of said in-phase component, and a delayed version of said quad phase component, said multiplexer circuit generating a multiplexer output;

a controller coupled to said multiplexer circuit and depuncturing said punctured digital data by causing said multiplexer inputs to appear on said multiplexer output in a predetermined pattern comprising an order that said punctured digital dam was in before it was punctured;

said controller generating a puncture signal that identifies which data signals on said multiplexer output have been punctured, wherein a given bit in the punctured digital data is not more than a predetermined number of bit spaces away from its position in the predetermined pattern.

14. A method of depuncturing punctured data, the steps comprising:

providing punctured digital data;

providing a delayed version of said punctured digital data;

multiplexing said punctured data and said delayed punctured data to a multiplexed output; and selecting said multiplexed output such that said punctured data and said delayed punctured data appear on said multiplexed output in a predetermined pattern, wherein a given bit in the punctured digital data is not more than a predetermined number of bit spaces away from its position in the predetermined pattern.

15. A method according to claim 14, wherein said predetermined pattern comprises an order of said punctured digital data before it was punctured.

16. A method according to claim 15, further comprising the step of generating a puncture signal that identifies which data signals on said multiplexed output have been punctured.

17. A method according to claim 14 wherein:

said punctured data comprises a first component and a second component; and said delayed version of said punctured data comprises a delayed first component and a delayed second component.

18. A method according to claim 17 wherein:

said first component comprises an in-phase component;

said second component comprises a quadrature-phase component;

said delayed first component comprises a delayed in-phase component; and said delayed second component comprises a delayed quadrature-phase component.

19. A method according to claim 14 wherein:

said punctured data comprises a time line of bit positions; and said delayed version of said punctured data comprises shifting said bit positions of said punctured stream of data by a predetermined number of bit positions.

20. A method according to claim 19 wherein said predetermined number is one.

* * * * *